(12) United States Patent
Fujita et al.

(10) Patent No.: US 7,417,489 B2
(45) Date of Patent: Aug. 26, 2008

(54) SEMICONDUCTOR INTEGRATED CIRCUIT HAVING CONTROLLER CONTROLLING THE CHANGE RATE OF POWER VOLTAGE

(75) Inventors: Tetsuya Fujita, Kawasaki (JP);
Fumitoshi Hatori, Yokohama (JP);
Mototsugu Hamada, Yokohama (JP);
Hiroyuki Hara, Fujisawa (JP);
Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 11/342,617

(22) Filed: Jan. 31, 2006

(65) Prior Publication Data
US 2006/0198198 A1 Sep. 7, 2006

(30) Foreign Application Priority Data
Feb. 4, 2005 (JP) ............................. 2005-028568

(51) Int. Cl.
*G05F 1/10* (2006.01)
(52) U.S. Cl. ..................................................... 327/534
(58) Field of Classification Search ................. 327/530, 327/534, 535, 540, 544
See application file for complete search history.

(56) References Cited
U.S. PATENT DOCUMENTS 5,583,457 A * 12/1996 Horiguchi et al. ........... 326/121
6,097,243 A * 8/2000 Bertin et al. ................. 327/544
6,333,669 B1 * 12/2001 Kobayashi et al. .......... 327/541
6,388,483 B1 * 5/2002 Mizuno et al. .............. 327/158
6,433,584 B1 * 8/2002 Hatae .......................... 326/80
6,774,705 B2 * 8/2004 Miyazaki et al. ............ 327/534
7,205,829 B2 * 4/2007 Herbert et al. .............. 327/540
7,212,067 B2 * 5/2007 Pasternak .................... 327/541

FOREIGN PATENT DOCUMENTS
JP 2003-330549 11/2003

OTHER PUBLICATIONS
U.S. Appl. No. 10/990,537, filed Nov. 18, 2004, Shinichiro, et al.

* cited by examiner

*Primary Examiner*—Jeffrey S Zweizig
(74) *Attorney, Agent, or Firm*—Oblon, Spivak, McClelland, Maier & Neustadt, P.C.

(57) ABSTRACT

A semiconductor integrated circuit comprising: a power controller which outputs a voltage select signal for selecting one of at least two types of voltages; a power supply voltage controller which generates and outputs a power supply voltage at an arbitrary voltage change rate on the basis of the voltage select signal; and a circuit portion which receives the power supply voltage and performs processing, wherein said circuit portion keeps operating while said power supply voltage controller is outputting the power supply voltage generated at the arbitrary voltage change rate.

14 Claims, 9 Drawing Sheets

SEMICONDUCTOR INTEGRATED CIRCUIT HAVING CONTROLLER CONTROLLING THE CHANGE RATE OF POWER VOLTAGE

CROSS REFERENCE TO RELATED APPLICATION

This application is based upon and claims benefit of priority under 35 USC § 119 from the Japanese Patent Application No. 2005-28568, filed on Feb. 4, 2005, the entire contents of which are incorporated herein by reference.

BACKGROUND OF THE INVENTION

The present invention relates to a semiconductor integrated circuit and, more particularly, to a semiconductor integrated circuit including a power supply voltage controller which limits the change rate when the power supply voltage is to be changed.

Recently, to reduce the power consumption of a semiconductor integrated circuit, the power supply voltage is dropped to a minimum necessary voltage in accordance with the operation state.

For example, a 100-MHz, 1.2-V semiconductor integrated circuit is sometimes operated by downing the power to 50 MHz and 0.9 V in accordance with the margin of the data processability. In this case, before the power supply voltages are switched, the clock is lowered from 100 MHz to 50 MHz to temporarily stop data processing. Then, the power supply voltage is lowered from 1.2 V to 0.9 V, and data processing is resumed after the voltage has stabilized.

To return to 100 MHz and 1.2 V, data processing is temporarily stopped before the power supply voltages are switched. After the power supply voltage is raised from 0.9 V to 1.2 V and the voltage has stabilized, the clock is returned from 50 MHz to 100 MHz to resume data processing.

This is so because, during the abrupt transition of the power supply voltage, a problem such as clock out of sync or circuit delay fluctuation arises, and it is necessary to avoid a period like this.

It is also necessary to avoid the problem that a period during which the power supply voltage falls outside the operating voltage is produced by overshoot caused by an abrupt transition of the power supply voltage. That is, it is necessary to avoid the event in which, assuming that the designed voltages are 1.2 V±0.05 V and 0.9 V±0.05 V, no stable operation can be ensured any longer because these voltage ranges are exceeded.

Conventionally, therefore, before and after the power supply voltages are switched, data processing must be temporarily stopped until the power supply voltage stabilizes, and this lowers the processing speed.

A reference disclosing the conventional semiconductor integrated circuit is as follows.

Japanese Patent Laid-Open No. 2003-330549

SUMMARY OF THE INVENTION

According to one aspect of the invention, there is provided a semiconductor integrated circuit comprising:
a power controller which outputs a voltage select signal for selecting one of at least two types of voltages;
a power supply voltage controller which generates and outputs a power supply voltage at an arbitrary voltage change rate on the basis of the voltage select signal; and
a circuit portion which receives the power supply voltage and performs processing,
wherein said circuit portion keeps operating while said power supply voltage controller is outputting the power supply voltage generated at the arbitrary voltage change rate.

According to one aspect of the invention, there is provided a semiconductor integrated circuit comprising:
a power controller which outputs a voltage select signal for selecting one of at least two types of voltages, and a clock select signal for selecting one of at least two types of clock frequencies as a clock;
a clock generator which receives the clock select signal, and generates and outputs the clock;
a power supply voltage controller which receives the voltage select signal, and generates and outputs a power supply voltage at an arbitrary voltage change rate; and
a circuit portion which receives the clock and power supply voltage and performs processing,
wherein when the power supply voltage is to be switched to a second voltage lower than a first voltage while said circuit portion is performing processing by using a clock having a first frequency and a power supply voltage having the first voltage,
said clock generator outputs a clock having a second frequency lower than the first frequency, and, after that,
said power supply voltage controller outputs a power supply voltage which is changed from the first voltage to the second voltage at the arbitrary voltage change rate,
on the basis of signals from said power controller.

DETAILED DESCRIPTION OF THE INVENTION

Embodiments of the present invention will be described below with reference to the accompanying drawings.

(1) First Embodiment

Figure 1:
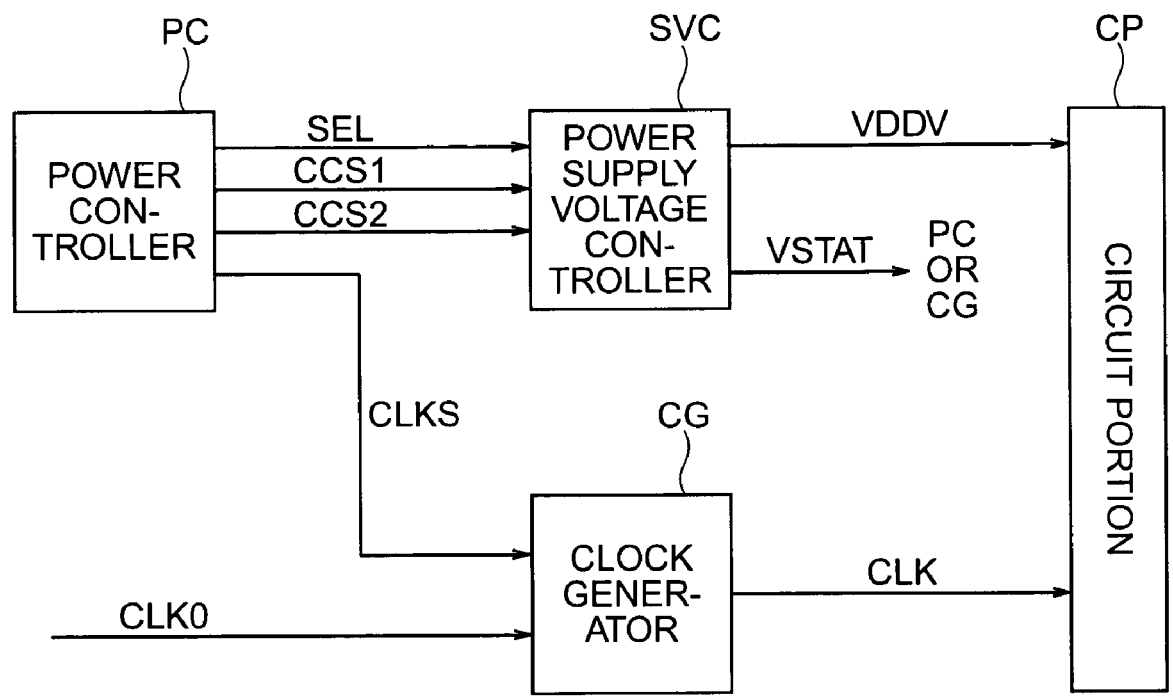
FIG. 1 is a circuit diagram showing the arrangement of a semiconductor integrated circuit according to the first embodiment of the present invention.

FIG. 1 shows the circuit configuration of a semiconductor integrated circuit according to the first embodiment of the present invention.

This semiconductor integrated circuit includes a power controller PC, power supply voltage controller SVC, clock generator CG, and circuit portion CP.

The power controller PC outputs, to the power supply voltage controller SVC, a voltage select signal SEL for selecting a power supply voltage, and current control signals CCS1 and CCS2 for limiting the current amount of a variable current source, and also outputs a clock select signal CLKS for selecting the frequency of a clock to the clock generator CG.

Upon receiving the voltage select signal SEL, the power supply voltage controller SVC selects a normally used voltage (e.g., 1.2 V) or at least one type of a relatively low voltage (e.g., 0.9 V) which is used to down the power, and outputs a power supply voltage VDDV. A maximum voltage change rate when the voltage is dropped or raised can be adjusted by the current control signals CCS1 and CCS2.

Also, when changing the power supply voltage VDDV, the power supply voltage controller SVC outputs, to the power controller PC or clock generator CG, a voltage state signal VSTAT indicating that the voltage state has stabilized after the change.

The clock generator CG receives a basic clock CLK0, and, on the basis of the clock select signal CLKS, outputs one of at least two types of frequencies (e.g., 100 and 50 MHz) as a clock CLK.

The circuit portion CP performs predetermined data processing by receiving the output clock CLK and power supply voltage VDDV.

The first embodiment having the above arrangement operates as follows in order to change the power supply voltage.

First, to down the power from the normally used high voltage (e.g., 1.2 V) to the low voltage (e.g., 0.9 V), the power controller PC outputs the clock select signal CLKS to the clock generator CG. On the basis of the clock select signal CLKS, the clock generator CG lowers the frequency of the clock CLK from a normally used high frequency (e.g., 100 MHz) to a low frequency (e.g., 50 MHz) which is used to down the power.

After that, the power controller PC outputs the voltage select signal SEL and current control signals CCS1 and CCS2 to the power supply voltage controller SVC, without stopping the data processing in the circuit portion CP. On the basis of the voltage select signal SEL, the power supply voltage controller SVC lowers the power supply voltage VDDV from the normally used high voltage to the low voltage. The power supply voltage controller SVC has a function of limiting the maximum voltage change rate, and lowers the voltage at a predetermined voltage change rate controllable by the current control signals CCS1 and CCS2.

When the low voltage is to be returned to the high normal voltage, the data processing in the circuit portion CP does not stop. In this case, the power controller PC outputs the voltage select signal SEL and current control signals CCS1 and CCS2 to the power supply voltage controller SVC. On the basis of the voltage select signal SEL, the power supply voltage controller SVC raises the power supply voltage VDDV from the low voltage to the normally used high voltage. Since the power supply voltage controller SVC has the function of limiting the maximum voltage change rate, it raises the voltage at a predetermined voltage change rate controllable by the current control signals CCS1 and CCS2.

Then, the power controller PC outputs the clock select signal CLKS to the clock generator CG. On the basis of the clock select signal CLKS, the clock generator CG returns the frequency of the clock CLK from the low frequency to the normally used high frequency.

As described above, by limiting the maximum voltage change rate when the power supply voltage VDDV is changed, the transition of the power supply voltage VDDV can be performed by a moderate and constant voltage change. This allows a clock synchronization adjusting circuit (not shown) to adjust clock out of sync while the circuit operation continues. As a consequence, clock out of sync can be reduced to a level which does not interfere with the circuit operation.

Also, since the transition of the power supply voltage VDDV is moderate, almost no overshoot occurs, so the power supply voltage VDDV does not fall outside the operating voltage standard.

In the conventional circuits as described earlier, the transition of the power supply voltage is abruptly performed within a short time period. This causes clock out of sync, or produces a period during which the power supply voltage falls outside the operating voltage owing to overshoot. This makes it unavoidable to stop data processing. By contrast, in the first embodiment described above, the transition of the power supply voltage is gently performed, so the production of a period like this can be prevented. Consequently, the voltages can be switched without stopping data processing in the circuit portion CP, and the processing speed can be increased.

(2) Second Embodiment

Figure 2:
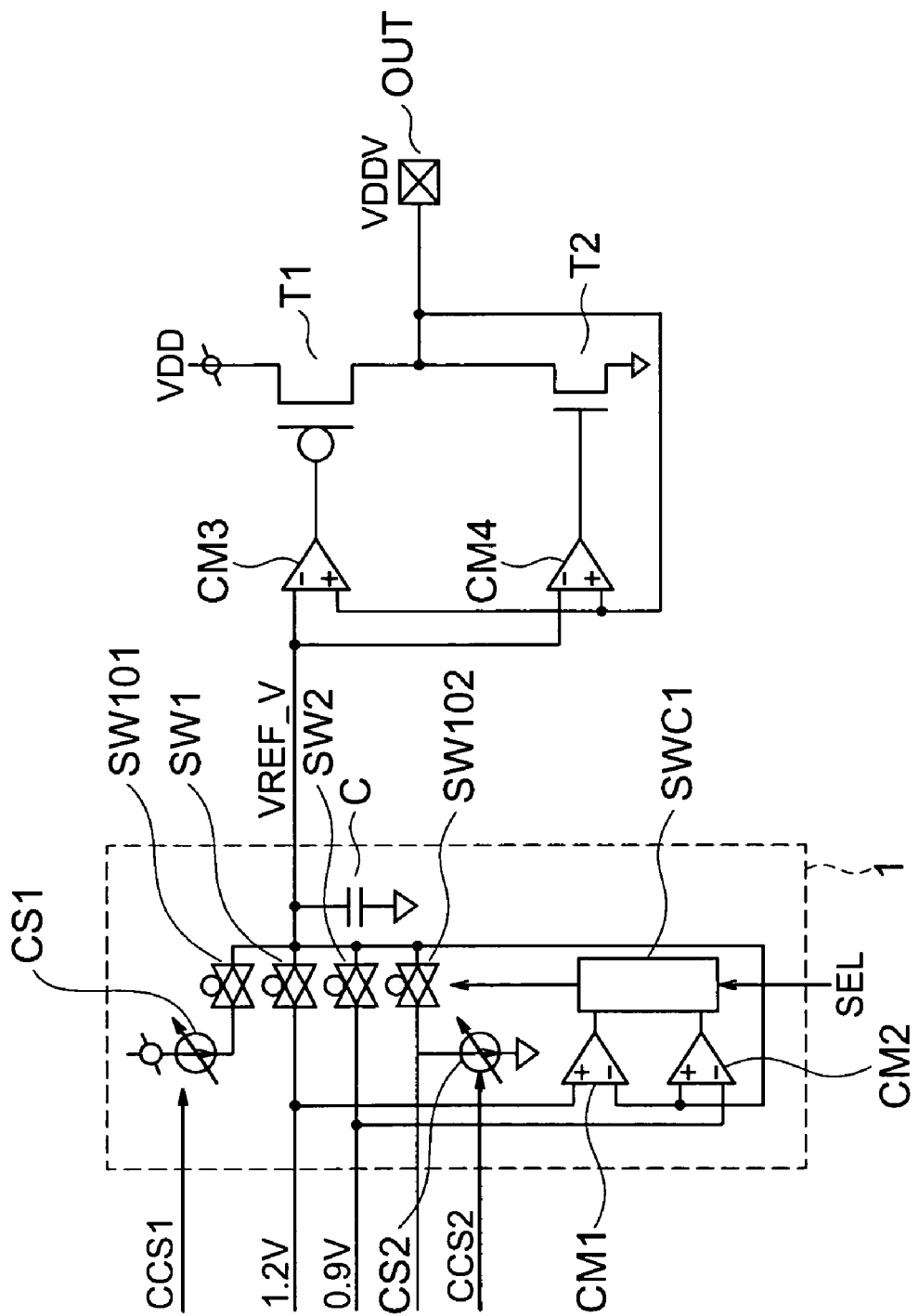
FIG. 2 is a circuit diagram showing the arrangement of a power supply voltage controller included in a semiconductor integrated circuit according to the second embodiment of the present invention.

FIG. 2 shows the circuit configuration of a power supply voltage controller included in a semiconductor integrated circuit according to the second embodiment of the present invention. The second embodiment relates to a practical circuit configuration of the power supply voltage controller SVC according to the first embodiment.

The power supply voltage controller SVC includes a maximum voltage change rate limiting unit 1, and a voltage output unit having voltage comparators CM3 and CM4 each of which is, e.g., an arithmetic amplifier, a P-channel MOS transistor T1, an N-channel MOS transistor T2, and an output terminal OUT.

The maximum voltage change rate limiting unit 1 receives two types of voltages of 1.2 V and 0.9 V, selects one voltage on the basis of a voltage select signal SEL, and outputs a reference voltage VREF_V.

Between a voltage VDD terminal and reference voltage VREF_V output terminal, a variable current source CS1 whose current amount is controllable by a current control signal CCS1 and a transmission gate switch SW101 for injecting an electric current are connected in series. A transmission gate switch SW1 is connected between an input terminal which receives 1.2 V and the reference voltage VREF_V output terminal. A transmission gate switch SW2 is connected between an input terminal which receives 0.9 V and the reference voltage VREF_V output terminal. Between the reference voltage VREF_V output terminal and a ground voltage VSS terminal, a transmission gate switch SW102 for discharging an electric current and a variable current source CS2 whose current amount is controllable by a current control signal CCS2 are connected in series.

Also, the voltage comparator CM1 has a non-inversion input terminal which receives 1.2 V, and an inversion input terminal which is connected to the reference voltage VREF_V output terminal. The voltage comparator CM2 has a non-inversion input terminal which is connected to the reference voltage VREF_V output terminal, and an inversion input terminal which receives 0.9 V.

The voltage comparator CM1 outputs a signal indicating whether the voltage of the reference voltage VREF_V output terminal is 1.2 V or more. The voltage comparator CM2 outputs a signal indicating whether the voltage of the reference voltage VREF_V output terminal is 0.9 V or less.

The output signals from the voltage comparators CM1 and CM2 are input to a switching controller SWC1. The switching controller SWC1 receives the voltage select signal SEL and the signals indicative of the comparison results from the voltage comparators CM1 and CM2, and controls ON/OFF of each of the transmission gate switches SW101, SW1, SW2, and SW102 as will be described later.

A capacitor C is connected between the reference voltage VREF_V output terminal and ground voltage VSS terminal. When the transmission gate switch SW101 is ON and the transmission gate switch SW102 is OFF, the variable current source CS1 injects an electric current into the capacitor C to raise the electric potential of the reference voltage VREF_V output terminal. When the transmission gate switch SW101 is OFF and the transmission gate switch SW102 is ON, the variable current source CS1 discharges an electric current from the capacitor C to drop the electric potential of the reference voltage VREF_V output terminal.

The maximum voltage change rate limiting unit 1 having the above arrangement has a function of moderating the potential change of the reference voltage VREF_V output terminal by injecting or discharging an electric current into or from the capacitor C, in order to limit a maximum change rate during the voltage transition.

The output voltage VREF_V from the maximum voltage change rate limiting unit 1 is input to the inversion input terminals of the voltage comparators CM3 and CM4. The non-inversion input terminals of the voltage comparators CM3 and CM4 are connected to the output terminal OUT.

Both the voltage comparators CM3 and CM4 check whether the electric potential of the output terminal OUT is lower than the reference voltage VREF_V. If the electric potential of the output terminal OUT is lower than the reference voltage VREF_V, the voltage comparators CM3 and CM4 output a low-level voltage. If the electric potential of the output terminal OUT is higher than the reference voltage VREF_V, the voltage comparators CM3 and CM4 output a high-level voltage.

Between the power supply voltage VDD terminal and output terminal OUT, the source and drain of the P-channel MOS transistor T1 are connected. Between the output terminal OUT and ground voltage VSS terminal, the drain and source of the N-channel MOS transistor T2 are connected.

If the voltage comparators CM3 and CM4 output the low level which indicates that the electric potential of the output terminal OUT is equal to or lower than the reference voltage VREF_V, the transistor T1 is turned on, the transistor T2 is turned off, and the electric potential of the output terminal OUT rises. If the voltage comparators CM3 and CM4 output the high level which indicates that the electric potential of the output terminal OUT is higher than the reference voltage VREF_V, the transistor T1 is turned off, the transistor T2 is turned on, and the electric potential of the output terminal OUT drops. In this manner, the two voltages are matched.

The voltage controller SVC according to the second embodiment having the above arrangement operates as follows.

In the maximum voltage change rate limiting unit 1, the switching controller SWC1 switches ON/OFF of the four transmission gate switches SW101, SW1, SW2, and SW102. In this way, one of 1.2 V and 0.9 V is output as the reference voltage VREF_V.

Of the two voltages, the transmission gate switch SW1 outputs 1.2 V to the reference voltage VREF_V output terminal, and the transmission gate switch SW1 outputs 0.9 V to the reference voltage VREF_V output terminal.

The transmission gate switch SW101 injects an electric current into the capacitor C connected to the reference voltage VREF_V output terminal from the voltage VDD terminal via the variable current source CS1. The transmission gate switch SW102 discharges an electric current from the capacitor C to the ground voltage VSS terminal via the variable current source CS2.

To drop the voltage from 1.2 V to 0.9 V, the transmission gate switches SW1 and SW2 are turned off, the transmission gate switch SW101 is turned off, and the transmission gate switch SW102 is turned on, thereby discharging an electric current from the capacitor C and dropping the reference voltage VREF_V of the reference voltage VREF_V output terminal.

To raise the voltage from 0.9 V to 1.2 V, the transmission gate switches SW1 and SW2 are turned off, the transmission gate switch SW102 is turned off, and the transmission gate switch SW101 is turned on, thereby injecting an electric current into the capacitor C and raising the voltage.

The two voltage comparators CM1 and CM2 check whether the reference voltage VREF_V of the reference voltage VREF_V output terminal has completed its transition between 1.2 V and 0.9 V and reached one of these voltages.

That is, the voltage comparator CM1 checks whether the reference voltage VREF_V has reached 1.2 V or more. If the reference voltage VREF_V has risen to 1.2 V, the voltage comparator CM1 notifies the switching controller SWC1 of this information. The voltage comparator CM2 checks whether the reference voltage VREF_V has reached 0.9 V or less. If the reference voltage VREF_V has dropped to 0.9 V, the voltage comparator CM2 notifies the switching controller SWC1 of this information.

On the basis of the voltage select signal SEL, the switching controller SWC1 switches ON/OFF of the transmission gate switch SW101 for current injection or the transmission gate switch SW102 for current discharge, thereby dropping or raising the voltage of the reference voltage VREF_V output terminal. On the basis of the notification from the voltage comparator CM1 or CM2, when the reference voltage VREF_V has reached the target voltage, the switching controller SWC1 turns on one of the transmission gate switches SW1 and SW2, which connects the input terminal of one of the two voltage levels and the reference voltage VREF_V output terminal which generates the reference voltage VREF_V and turns off the other.

The output reference voltage VREF_V is input to the inversion input terminals of the comparators CM3 and CM4. The electric potential of the output terminal VDDV is input to the non-inversion input terminals of the comparators CM3 and CM4.

The operations of the comparators CM3 and CM4 and transistors T1 and T2 are the same as in the first embodiment, so an explanation thereof will be omitted.

In the second embodiment, when the power supply voltage VDDV is dropped from 1.2 V to 0.9 V or returned from 0.9 V to 1.2 V, the transmission gate switch SW101 or SW102 controls the current injection amount or current discharge amount of the capacitor C of the reference voltage VREF_V output terminal in accordance with the current control signals CCS1 and CCS2. Accordingly, the maximum voltage change rate of the power supply voltage VDDV can be limited.

By thus limiting the maximum voltage change rate, the transition of the power supply voltage VDDV can be performed by a moderate and constant voltage change. This allows a clock synchronization adjusting circuit to adjust clock out of sync while the circuit operation continues. Consequently, clock out of sync can be reduced to a level which does not interfere with the circuit operation.

Also, since the transition of the power supply voltage VDDV is moderate, almost no overshoot occurs, so the power supply voltage VDDV does not fall outside the operating voltage standard. As a consequence, the voltages can be switched without stopping data processing, so the processing speed increases.

For example, consider a case in which a 100-MHz, 1.2-V semiconductor integrated circuit is used by downing the power to 50 MHz and 0.9 V in accordance with the margin of the data processability at that point.

Figure 3:
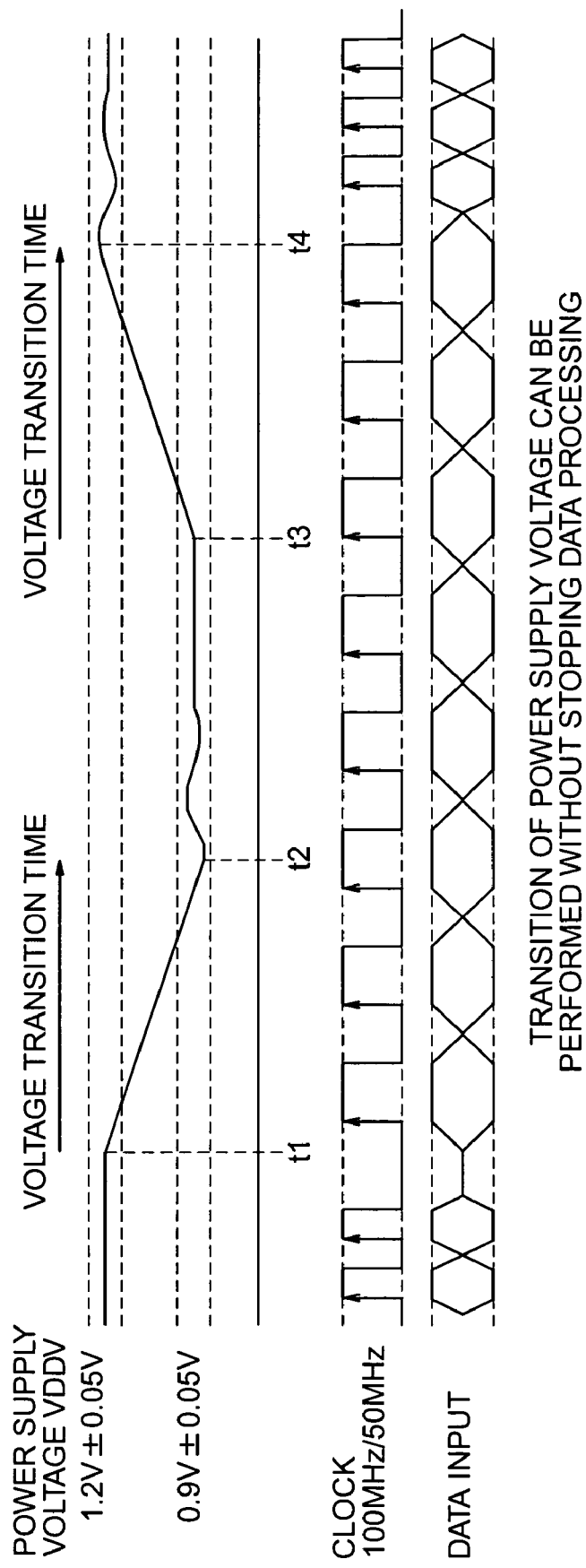
FIG. 3 is a timing chart showing the transition of the voltage and clock and data processing when the power supply voltages are switched in the second embodiment.

As shown in FIG. 3, before the power supply voltage VDDV is switched from 1.2 V to 0.9 V, the clock is dropped from 100 MHz to 50 MHz.

Then, at time t1, the power supply voltage VDDV is slowly lowered from 1.2 V without stopping data processing. At time t2, the power supply voltage VDDV stabilizes at 0.9 V.

On the other hand, to return to 100 MHz and 1.2 V, the power supply voltage VDDV is gently raised at time t3 from 0.9 without stopping data processing, before the clock is returned from 50 MHz to 100 MHz. After the power supply voltage VDDV has reached 1.2 V and stabilized at time t4, the clock is returned from 50 MHz to 100 MHz.

In the second embodiment as described above, the power supply voltage VDDV can be changed from 1.2 V to 0.9 V or vice versa, while data processing is not stopped but continued. This increases the data processing speed.

When the power supply voltage VDDV is dropped or raised, an optimum transition time changes in accordance with, e.g., a clock distribution method or clock skew control method, or with, e.g., the size of the parasitic capacitance between the power supply voltage VDD terminal and ground voltage VSS terminal.

Figure 4:
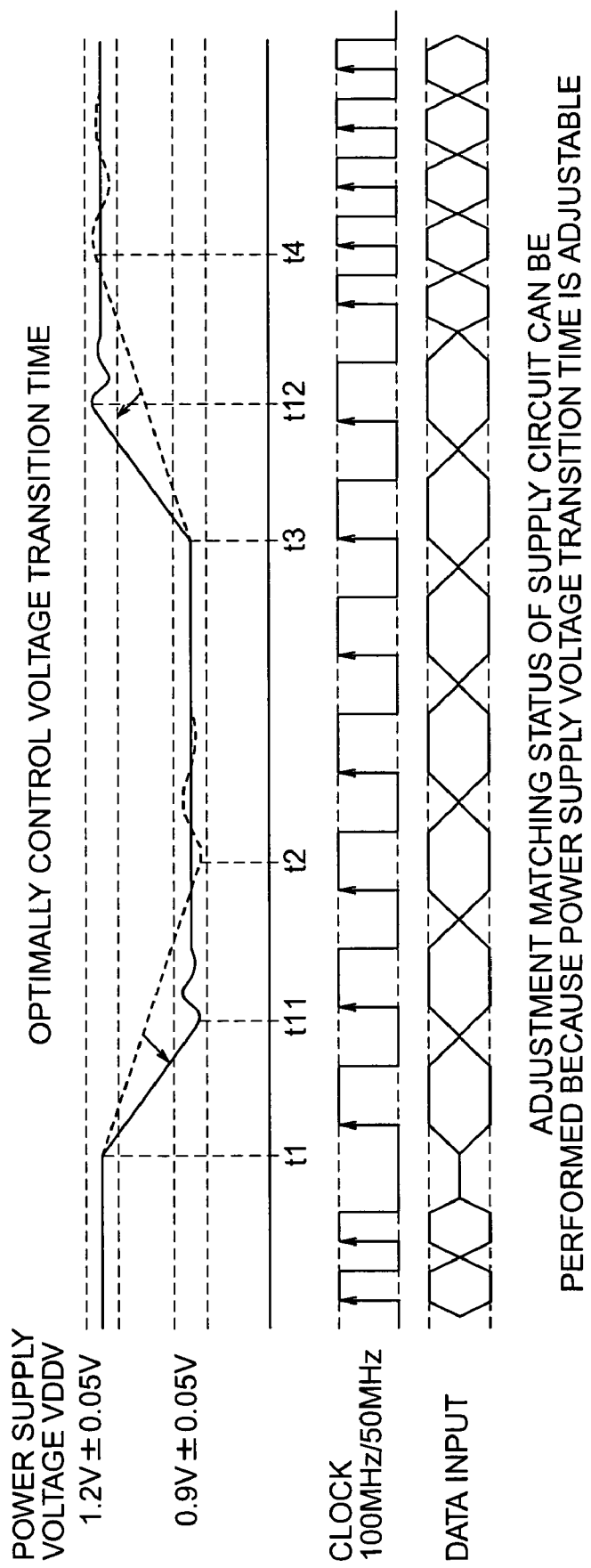
FIG. 4 is a timing chart showing the transition of the voltage and clock and data processing when a maximum voltage change rate is adjusted during the switching between the power supply voltages in the second embodiment.

When, therefore, the transition time can be shortened, for example, as shown in FIG. 4, the power supply voltage VDDV is dropped from 1.2 V at time t1, and stabilized at 0.9 V at time t11 earlier than time t2. To return to 1.2 V, the power supply voltage VDDV is raised from time t3, and stabilized at time t12 earlier than time t4. On the other hand, when it is necessary to prolong the transition time, the power supply voltage VDDV is dropped from 1.2 V at time t1, and stabilized at 0.9 V later than time t2. To return to 1.2 V, the power supply voltage VDDV is raised from time t3, and stabilized at 1.2 V later than time t4. The transition time can be set in this way.

In the second embodiment as described above, even after the fabrication of the semiconductor integrated circuit, the transition time can be adjusted by controlling the current injection rate or current discharge rate of the capacitor C by the current control signals CCS1 and CCS2.

Figure 5:
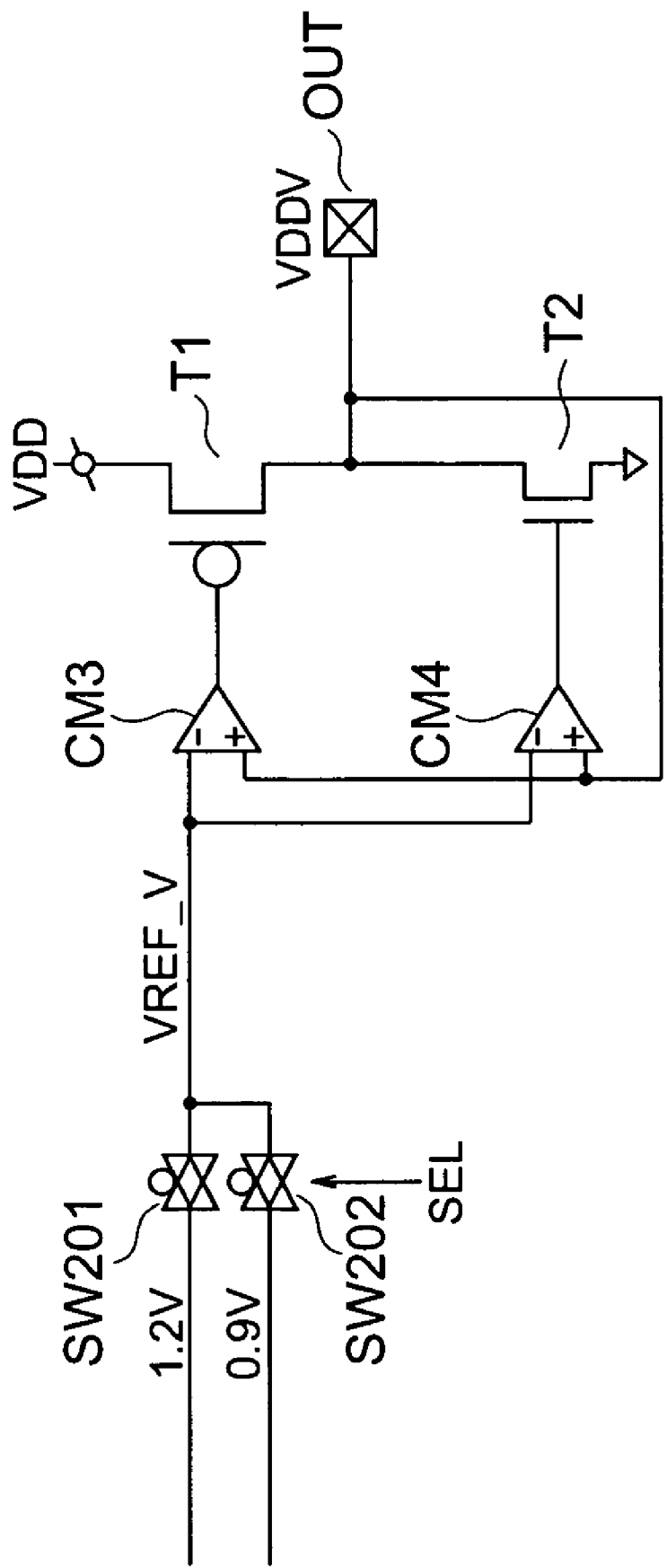
FIG. 5 is a circuit diagram showing the arrangement of a power supply voltage controller included in a semiconductor integrated circuit according to a comparative example.

FIG. 5 shows the arrangement of a power supply voltage controller of a semiconductor integrated circuit as a comparative example of the above second embodiment.

In this comparative example, a transmission gate switch SW201 is connected between a reference voltage VREF_V output terminal which outputs a reference voltage VREF_V and an input terminal which receives 1.2 V, and a transmission gate switch SW202 is connected between the reference voltage VREF_V output terminal and an input terminal which receives 0.9 V. The transmission gate switches SW201 and SW202 are controlled by a voltage select signal SEL. The rest of the arrangement is the same as the first embodiment described earlier, so an explanation thereof will be omitted.

Figure 6:
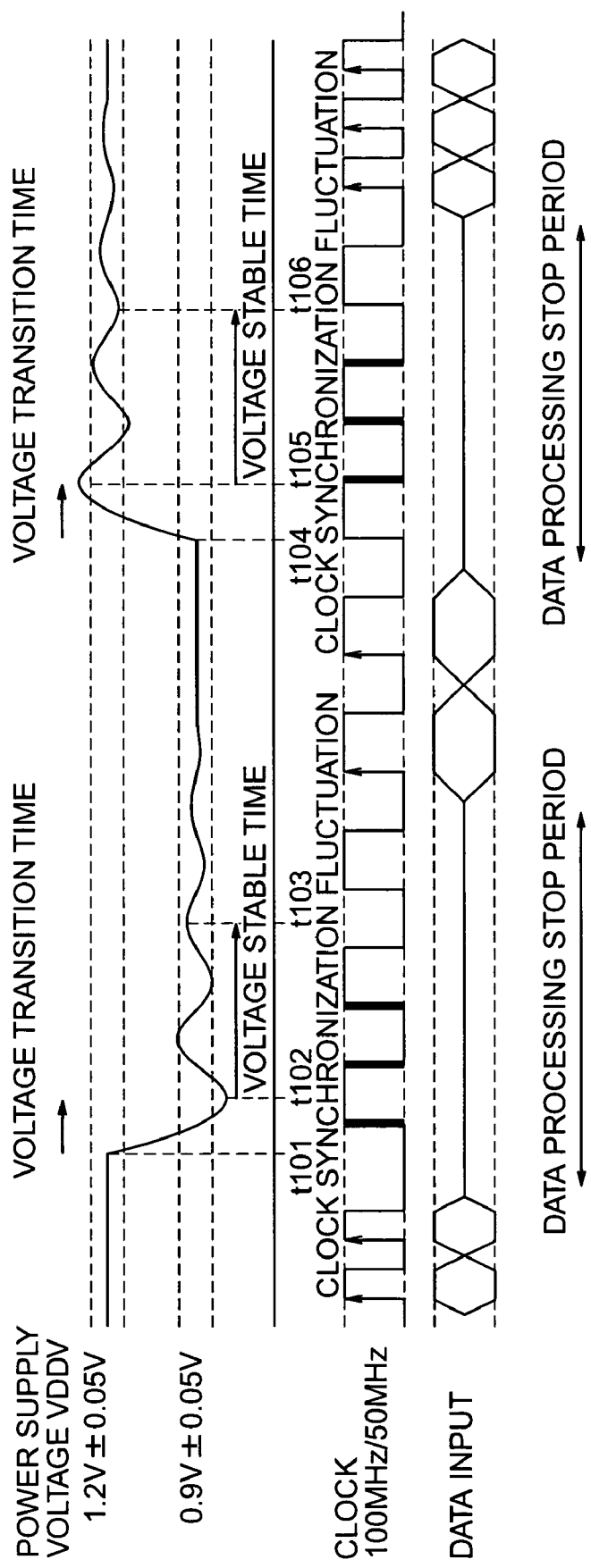
FIG. 6 is a timing chart showing the transition of the voltage and clock and data processing when the power supply voltages are switched in the comparative example.

In the comparative example having the above arrangement, a power supply voltage VDDV changes as shown in FIG. 6 when dropped from 1.2 V to 0.9 V and when returned to 1.2 V.

Before the power supply voltage VDDV is switched from 1.2 V to 0.9 V, a clock is dropped from 100 MHz to 50 MHz.

Then, data processing is stopped, and the power supply voltage VDDV is dropped at time t101 from 1.2 V to 0.9 V faster than in the above embodiment. Although the power supply voltage VDDV reaches 0.9 V at time t102, a long time is required before time t103 at which the voltage stabilizes. Data processing is resumed after time t103.

To return to 100 MHz and 1.2 V, data processing is stopped first, and then at time t104 the power supply voltage VDDV is rapidly raised from 0.9 V to 1.2 V. Although the power supply voltage VDDV reaches 1.2 V at time t105, a long time is required before time t106 at which the voltage stabilizes. After time t106, the clock is returned from 50 MHz to 100 MHz to resume data processing.

In this comparative example as described above, the voltage switching is controlled only by ON/OFF of the transmission gate switches SW201 and SW202. This increases the rates of voltage drop and rise, and prolongs the time required before the voltage stabilizes. Since data processing must be stopped until the voltage stabilizes, the processing efficiency lowers.

By contrast, in the first and second embodiments, the voltage can be gently changed by controlling the maximum voltage change rate, so the voltage transition can be performed while data processing continues. As a consequence, the processing efficiency can be increased.

(3) Third Embodiment

Figure 7:
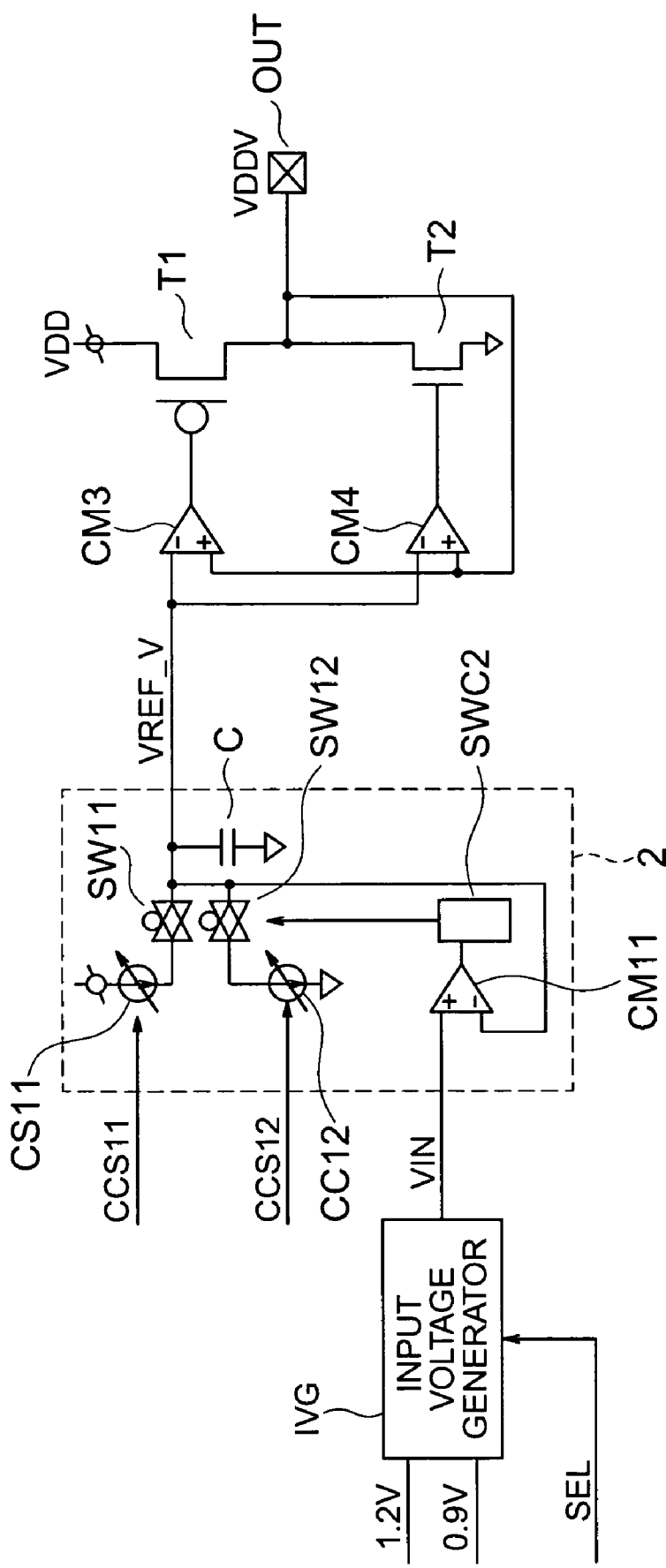
FIG. 7 is a circuit diagram showing the arrangement of a power supply voltage controller included in a semiconductor integrated circuit according to the third embodiment of the present invention.

FIG. 7 shows the arrangement of a power supply voltage controller of a semiconductor integrated circuit according to the third embodiment of the present invention. The third embodiment differs from the second embodiment in the arrangement of a maximum voltage change rate limiting unit 2.

In the maximum voltage change rate limiting unit 2, a variable current source CS11 and transmission gate switch SW11 are connected in series between a power supply voltage VDD terminal and reference voltage VREF_V output terminal, and a transmission gate switch SW12 and variable current source CS12 are connected in series between the reference voltage VREF_V output terminal and a ground voltage VSS terminal.

When turned on, the transmission gate switch SW11 injects, via the variable current source CS11, an electric current into a capacitor C connected to the reference voltage VREF_V output terminal. When turned on, the transmission gate switch SW12 discharges an electric current from the capacitor C of the reference voltage VREF_V output terminal via the variable current source CS12.

A comparator CM11 has a non-inversion input terminal which receives an input voltage VIN, and an inversion input terminal connected to the reference voltage VREF_V output terminal. The input voltage VIN is generated when 1.2 V and 0.9 V are input to an input voltage generator IVG, and one of these voltages is selected by a voltage select signal SEL.

When the comparator CM11 determines that a reference voltage VREF_V of the reference voltage output terminal matches the input voltage VIN, a switching controller SWC2 is notified of this information.

The switching controller SWC2 is a device which controls ON/OFF of the transmission gate switches SW11 and SW12 such that the reference voltage VREF_V of the reference voltage VREF_V output terminal matches the input voltage VIN. The rest of the arrangement is the same as the second embodiment described above so an explanation thereof will be omitted.

In the third embodiment, even when the input voltage VIN discretely changes, the maximum voltage change rate of the voltage transition is limited. Accordingly, the same effects as in the first and second embodiments are obtained.

(4) Fourth Embodiment

Figure 8:
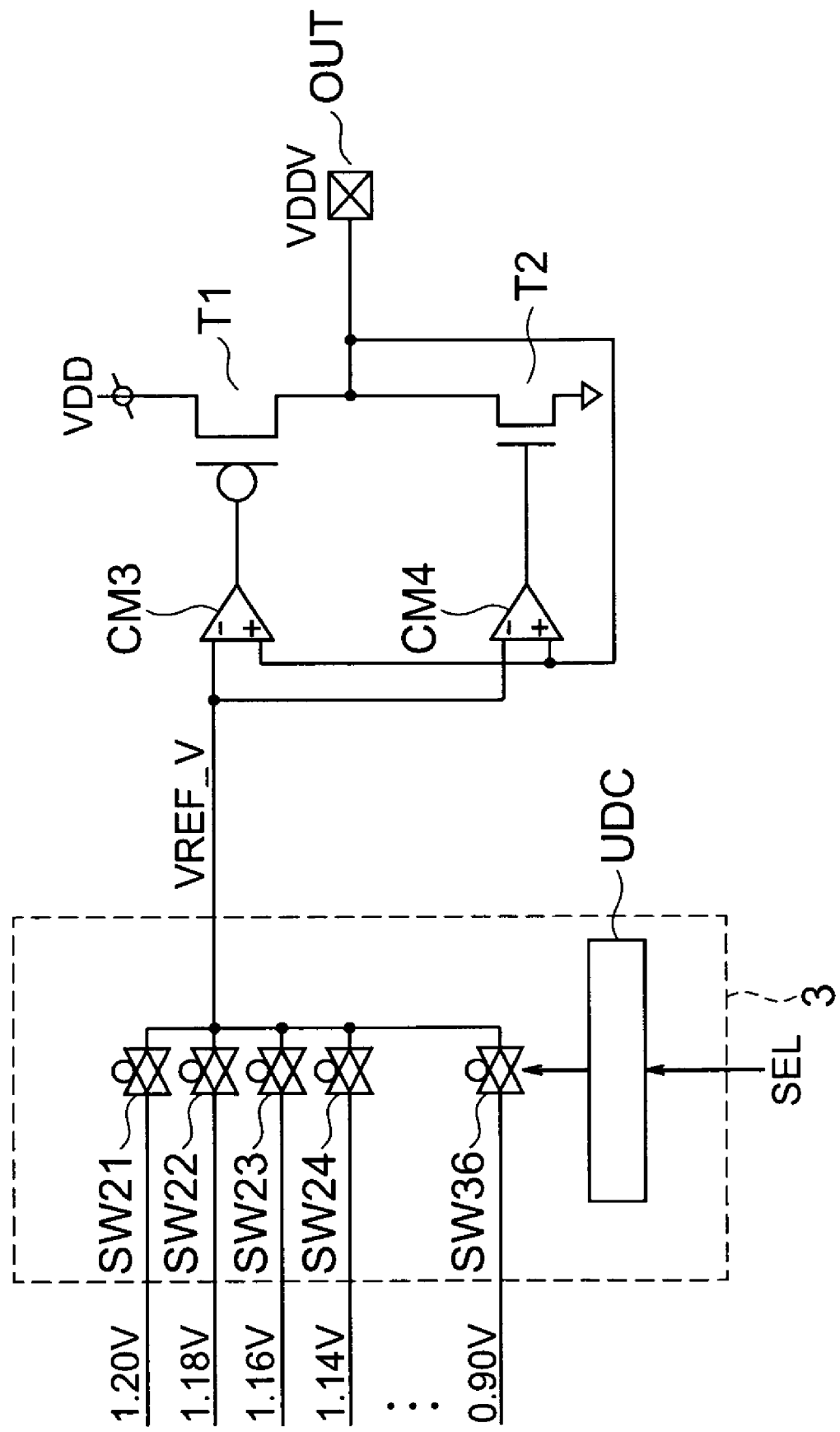
FIG. 8 is a circuit diagram showing the arrangement of a power supply voltage controller included in a semiconductor integrated circuit according to the fourth embodiment of the present invention.

FIG. 8 shows the arrangement of a power supply voltage controller of a semiconductor integrated circuit according to the fourth embodiment of the present invention. This power supply voltage controller of the fourth embodiment is characterized in that a maximum voltage change rate limiting unit 3 includes n (n is an integer of 2 or more) transmission gate switches and an up/down counter UDC.

A transmission gate switch SW21 is connected in series between an input terminal which receives a voltage of 1.20 V and a reference voltage VREF_V output terminal, a transmission gate switch SW22 is connected in series between an input terminal which receives a voltage of 1.18 V and the reference voltage VREF_V output terminal, a transmission gate switch SW23 is connected in series between an input terminal which receives a voltage of 1.16 V and the reference voltage VREF_V output terminal, a transmission gate switch SW24 is connected in series between an input terminal which receives a voltage of 1.14 V and the reference voltage VREF_V output terminal, . . . , a transmission gate switch SW36 is connected in series between an input terminal which receives a voltage of 0.90 V and the reference voltage VREF_V output terminal.

ON/OFF operations of the transmission gate switches SW21 to SW36 are sequentially controlled by the up/down counter UDC.

For example, when a voltage of 1.20 V is supplied, the transmission gate switch SW21 is initially ON, the transmission gate switches SW22 to SW36 are initially OFF, and 1.20 V is initially output as a reference voltage VREF_V to the reference voltage VREF_V output terminal via the transmission gate switch SW21.

To drop the voltage to 0.90 V from this state, 1.18 V is output by turning on only the transmission gate switch SW22 and turning off all the other switches, 1.16 V is output by turning on only the transmission gate switch SW23 and turning off all the other switches, . . . , 0.90 V is output as the reference voltage VREF_V by turning on only the transmission gate switch SW36 and turning off all the other switches. In this manner, the voltage can be dropped step by step at an interval of 0.02 V.

On the other hand, to raise the voltage from 0.90 V to 1.20 V, the transmission gate switch SW36 is initially ON, the transmission gate switches SW21 to SW35 are initially OFF, and 0.90 V is initially output as the reference voltage VREF_V to the reference voltage VREF_V output terminal. From this state, 0.92 V is output by turning on only the transmission gate switch SW34 and turning off all the other switches, . . . , 1.20 V is output by turning on only the transmission gate switch SW21 and turning off all the other switches.

In the fourth embodiment as described above, the levels of the reference voltage VREF_V are prepared from 1.2 V to 0.9 V at an interval of 0.02 V, and the operations of the transmission gate switches SW21 to SW36 are continuously switched by the up/down counter UDC. Consequently, the maximum change rate of a power supply voltage VDDV can be limited as in the first to third embodiments described above.

A maximum voltage change rate per unit time is determined by the interval of the voltage steps and the switching rate. For example, to set the maximum voltage change rate at a lowest value, all the transmission gate switches SW21 to SW36 are sequentially turned on or off at an interval of 0.02 V as described above.

To increase the maximum voltage change rate, ON/OFF of every other transmission gate switch, i.e., the transmission gate switches SW21, SW23, SW25, . . . , SW33, SW35, and SW36 is controlled so that the voltage changes at an interval of, e.g., 0.04 V. To further increase the maximum voltage change rate, ON/OFF of every third transmission gate switch, i.e., the transmission gate switches SW21, SW24, SW27, SW30, SW33, and SW36 is controlled so that the voltage changes at an interval of, e.g., 0.06 V.

Alternatively, it is also possible to set the maximum voltage change rate by the switching rate, while the interval of the voltage steps is kept at 0.02 V.

(5) Fifth Embodiment

Figure 9:
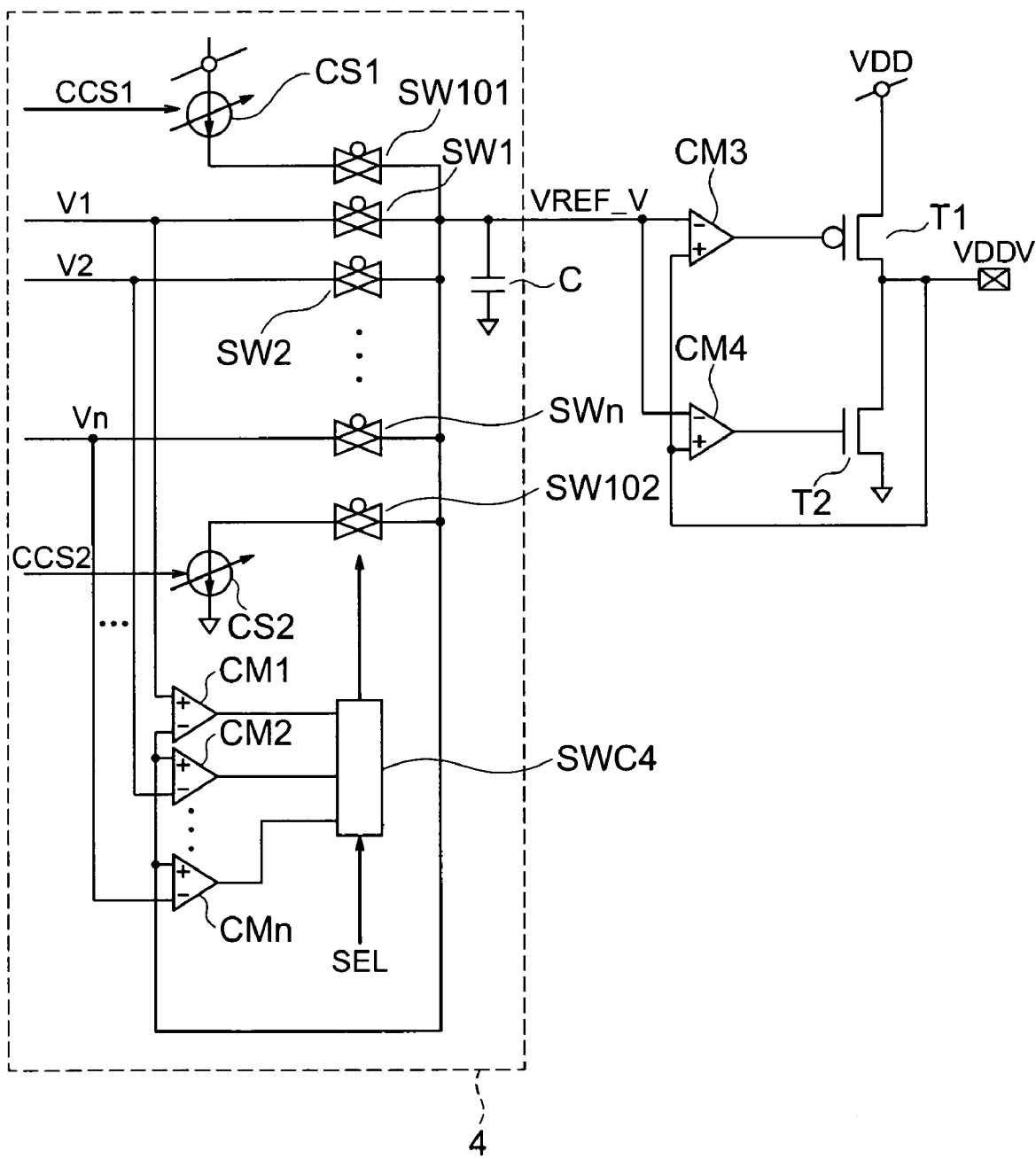
FIG. 9 is a circuit diagram showing the arrangement of a power supply voltage controller included in a semiconductor integrated circuit according to the fifth embodiment of the present invention.

FIG. 9 shows the arrangement of a semiconductor integrated circuit according to the fifth embodiment of the present invention. In the maximum voltage change rate limiting units 1 to 3 of the voltage controllers SVC according to the second to fourth embodiments described above, only two types of voltages, i.e., a normally used high voltage of 1.2 V and a low voltage of 0.9 V which is used to down the power are prepared. By contrast, in a maximum voltage change rate limiting unit 4 of a voltage controller SVC according to the fifth embodiment, voltages V1 to Vn (n is an integer of 2 or more, and V1>V2> . . . >Vn) which are not limited to two types but can be three types or more are prepared.

In the maximum voltage change rate limiting unit 4, a variable current source CS1 and a transmission gate switch SW101 for injecting an electric current are connected in series between a voltage VDD terminal and reference voltage VREF_V output terminal, a transmission gate switch SW1 is connected between an input terminal which receives the highest voltage V1 and the reference voltage VREF_V output terminal, a transmission gate switch SW2 is connected between an input terminal which receives the second highest voltage V2 and the reference voltage VREF_V output terminal, . . . , a transmission gate switch SW(n−1) (not shown) is connected between an input terminal which receives the second lowest voltage V(n−1) and the reference voltage VREF_V output terminal, a transmission gate switch SWn is connected between an input terminal which receives the lowest voltage Vn and the reference voltage VREF_V output terminal, and a transmission gate switch SW102 for discharging an electric current and a variable current source CS2 are connected in series between the reference voltage VREF_V output terminal and a ground voltage VSS terminal.

A voltage comparator CM1 has a non-inversion input terminal which receives the voltage V1, and an inversion input terminal which is connected to the reference voltage VREF_V output terminal, a voltage comparator CM2 has a non-inversion input terminal which is connected to the reference voltage VREF_V output terminal, and an inversion input terminal which receives the voltage V2, a voltage comparator CM3 (not shown) has a non-inversion input terminal which is connected to the reference voltage VREF_V output terminal, and an inversion input terminal which receives the voltage V3, . . . , a voltage comparator CMn has a non-inversion input terminal which is connected to the reference voltage VREF_V output terminal, and an inversion input terminal which receives the voltage Vn.

The voltage comparator CM1 outputs a signal indicating whether the voltage of the reference voltage VREF_V output terminal is the voltage V1 or more. The voltage comparator CM2 outputs a signal indicating whether the voltage of the reference voltage VREF_V output terminal is the voltage V2 or less.

The voltage comparator CM3 outputs a signal indicating whether the voltage of the reference voltage VREF_V output terminal is the voltage V3 or less, . . . , the voltage comparator CMn outputs a signal indicating whether the voltage of the reference voltage VREF_V output terminal is lower than the voltage Vn.

The output signals from the voltage comparators CM1 to CMn are input to a switching controller SWC4. The switching controller SWC4 receives a voltage select signal SEL and the signals indicative of the comparison results from the voltage comparators CM1 to CMn, and controls ON/OFF of each of the transmission gate switches SW1 to SWn. The rest of the arrangement is the same as the power supply voltage controller according to the second embodiment, so an explanation thereof will be omitted.

In the fifth embodiment, to drop the voltage from the normally used highest voltage V1 in order to down the power, a desired voltage is selected from the voltages V2 to Vn by the voltage select signal SEL. If, for example, the voltage V3 is selected, the switching controller SWC4 turns off all the transmission gate switches SW101 and SW1 to SWn, and turns on only the transmission gate switch SW102, thereby discharging an electric current from a capacitor C of the reference voltage VREF_V output terminal. Accordingly, the electric potential of the reference voltage VREF_V output terminal gradually drops.

When the voltage comparator CM3 detects that the electric potential of the reference voltage VREF_V output terminal is the same as the voltage V3, the switching controller SWC4 turns on only the transmission gate switch SW3, and turns off all the other transmission gate switches SW101, SW1, SW2, SW4 to SWn, and SW102. As a consequence, a reference voltage VREF_V having the stable voltage V3 is output from the reference voltage VREF_V output terminal.

To return to the voltage V1 from the voltage V3, the voltage select signal SEL selects the voltage V1, the switching controller SWC4 turns off all the transmission gate switches SW1 to SWn, and turns on only the transmission gate switch SW101, thereby injecting an electric current into the capacitor C of the reference voltage VREF_V output terminal. Accordingly, the electric potential of the reference voltage VREF_V output terminal gradually rises.

When the voltage comparator CM1 detects that the electric potential of the reference voltage VREF_V output terminal is the same as the voltage V1, the switching controller SWC4 turns on only the transmission gate switch SW1, and turns off all the other transmission gate switches SW101, SW2 to SWn, and SW102. As a consequence, the reference voltage VREF_V equal to the voltage V1 is output from the reference voltage VREF_V output terminal.

As in the second embodiment described above, the electric potential of the power supply voltage VDDV can be slowly changed in the fifth embodiment as well by limiting a maximum change rate by the maximum voltage change rate limiting unit 4 during the transition of a selected voltage.

In each of the first to fifth embodiments as explained above, when at least two types of voltages are switched in a semiconductor integrated circuit including a power supply voltage controller, a maximum voltage change rate can be limited during the transition of the power supply voltage.

In this way, the transition of the power supply voltage is performed by a moderate and constant voltage change, clock out of sync and circuit delay fluctuation are reduced to a level which does not interfere with the circuit operation, and almost no overshoot occurs. Therefore, voltage switching can be performed without stopping data processing. This increases the efficiency of data processing.

As described above, an optimum transition time of the power supply voltage changes in accordance with, e.g., a clock distribution method or clock skew control of a circuit which supplies the power supply voltage, or the capacitance between the power supply voltage terminal and ground terminal. Therefore, even after a trial product is fabricated, it is possible, by limiting a maximum voltage change rate by a control signal, to adjust the return time from the power down state, i.e., the transition time during which the voltage rises, or to adjust the transition time to the power down state. Consequently, the performance can be further improved.

In the semiconductor integrated circuits of the above embodiments, the operation can continue even while the power supply voltages are switched. This increases the data processing speed.

The above embodiments are merely examples, and hence do not limit the present invention. Therefore, these embodiments can be variously modified within the technical scope of the present invention.

For example, the current amount of the variable current source need not be controlled by the current control signal as in the second embodiment. That is, it is also possible to store a predetermined value by using a memory such as a fuse memory, and control an electric current to flow on the basis of this value.

Also, if the voltage transition is linear and moderate, the semiconductor integrated circuit can determine an optimum power supply voltage by using its own self-diagnostic function in combination with the above function of the present invention. In this case, it is possible to stop the power supply voltage at an intermediate level during the course of transition, and change the voltage set before the transition.

What is claimed is:

1. A semiconductor integrated circuit comprising:
a power controller which outputs a voltage select signal for selecting one of at least two types of voltages, and a clock select signal for selecting one of at least two types of clock frequencies as a clock;
a clock generator which receives the clock select signal, and generates and outputs the clock;
a power supply voltage controller which receives the voltage select signal, and generates and outputs a power supply voltage at an arbitrary voltage change rate; and
a circuit portion which receives the clock and power supply voltage and performs processing,
wherein when the power supply voltage is to be switched to a second voltage lower than a first voltage while said circuit portion is performing processing by using a clock having a first frequency and a power supply voltage having the first voltage,
said clock generator outputs a clock having a second frequency lower than the first frequency, and, after that,
said power supply voltage controller outputs a power supply voltage which is changed from the first voltage to the second voltage at the arbitrary voltage change rate, on the basis of signals from said power controller;
wherein said power supply voltage controller comprises:

a maximum voltage change rate limiting unit comprising
a first current source and first switch connected in series between a power supply terminal and reference voltage output terminal,
a second switch connected in series between a first input terminal which receives the first voltage and said reference voltage output terminal,
a third switch connected in series between a second input terminal which receives one type of a voltage as the second voltage and said reference voltage output terminal,
a fourth switch and second current source connected in series between said reference voltage output terminal and a ground terminal,
a capacitor connected between said reference voltage output terminal and ground terminal,
a first voltage comparator which compares the first voltage from said first input terminal with a reference voltage from said reference voltage output terminal, and outputs a first comparison result,
a second voltage comparator which compares the second voltage from said second input terminal with the reference voltage from said reference voltage output terminal, and
outputs a second comparison result,
a switching controller which receives the voltage select signal and first and second comparison results, and controls ON/OFF operations of said first to fourth switches; and
a voltage output unit which is connected to said power supply terminal, receives the reference voltage output from said reference voltage output terminal, and outputs, to said circuit portion, a voltage having the reference voltage as the power supply voltage.

2. A circuit according to claim 1, wherein when switching the first voltage to the second voltage,
said switching controller turns on only said fourth switch to discharge an electric current from said capacitor and drop the voltage of said reference voltage output terminal at the arbitrary voltage change rate, and, on the basis of the second comparison result, turns on only said third switch to output the second voltage from said reference voltage output terminal, and
when switching the second voltage to the first voltage,
said switching controller turns on only said first switch to inject an electric current into said capacitor and raise the voltage of said reference voltage output terminal at the arbitrary voltage change rate, and, on the basis of the first comparison result, turns on only said second switch to output the first voltage from said reference voltage output terminal.

3. A circuit according to claim 1, wherein
each of said first and second current sources is a variable current source, and
said power controller adjusts a voltage change rate at which the second voltage is changed to the first voltage, by outputting, to said first current source, a first current control signal for controlling a current amount of said first current source, and adjusts a voltage change rate at which the first voltage is changed to the second voltage, by outputting, to said second current source, a second current control signal for controlling an electric current amount of said second current source.

4. A semiconductor integrated circuit comprising:
a power controller which outputs a voltage select signal for selecting one of at least two types of voltages, and a clock select signal for selecting one of at least two types of clock frequencies as a clock;
a clock generator which receives the clock select signal, and generates and outputs the clock;
a power supply voltage controller which receives the voltage select signal, and generates and outputs a power supply voltage at an arbitrary voltage change rate; and
a circuit portion which receives the clock and power supply voltage and performs processing,
wherein when the power supply voltage is to be switched to a second voltage lower than a first voltage while said circuit portion is performing processing by using a clock having a first frequency and a power supply voltage having the first voltage,
said clock generator outputs a clock having a second frequency lower than the first frequency, and, after that,
said power supply voltage controller outputs a power supply voltage which is changed from the first voltage to the second voltage at the arbitrary voltage change rate,
on the basis of signals from said power controller;
wherein when the power supply voltage is to be switched from the second voltage to the first voltage while said circuit portion is performing processing by using a clock having the second frequency and a power supply voltage having the second voltage,
said power supply voltage controller outputs a power supply voltage which is changed from the second voltage to the first voltage at the arbitrary voltage change rate, and, after that,
said clock generator outputs a clock having the first frequency,
on the basis of signals from said power controller;
wherein said power supply voltage controller comprises:
a maximum voltage change rate limiting unit comprising
a first current source and first switch connected in series between a power supply terminal and reference voltage output terminal,
a second switch connected in series between a first input terminal which receives the first voltage and said reference voltage output terminal,
a third switch connected in series between a second input terminal which receives one type of a voltage as the second voltage and said reference voltage output terminal,
a fourth switch and second current source connected in series between said reference voltage output terminal and a ground terminal,
a capacitor connected between said reference voltage output terminal and ground terminal,
a first voltage comparator which compares the first voltage from said first input terminal with a reference voltage from said reference voltage output terminal, and outputs a first comparison result,
a second voltage comparator which compares the second voltage from said second input terminal with the reference voltage from said reference voltage output terminal, and
outputs a second comparison result,
a switching controller which receives the voltage select signal and first and second comparison results, and controls ON/OFF operations of said first to fourth switches; and
a voltage output unit which is connected to said power supply terminal, receives the reference voltage output from said reference voltage output terminal, and outputs, to said circuit portion, a voltage having the reference voltage as the power supply voltage.

5. A circuit according to claim 4, wherein
when switching the first voltage to the second voltage,
said switching controller turns on only said fourth switch to discharge an electric current from said capacitor and drop the voltage of said reference voltage output terminal at the arbitrary voltage change rate, and, on the basis of the second comparison result, turns on only said third switch to output the second voltage from said reference voltage output terminal, and
when switching the second voltage to the first voltage,
said switching controller turns on only said first switch to inject an electric current into said capacitor and raise the voltage of said reference voltage output terminal at the arbitrary voltage change rate, and, on the basis of the first comparison result, turns on only said second switch to output the first voltage from said reference voltage output terminal.

6. A circuit according to claim 4, wherein
each of said first and second current sources is a variable current source, and
said power controller adjusts a voltage change rate at which the second voltage is changed to the first voltage, by outputting, to said first current source, a first current control signal for controlling a current amount of said first current source, and adjusts a voltage change rate at which the first voltage is changed to the second voltage, by outputting, to said second current source, a second current control signal for controlling an electric current amount of said second current source.

7. A semiconductor integrated circuit comprising:
a power controller which outputs a voltage select signal for selecting one of at least two types of voltages, and a clock select signal for selecting one of at least two types of clock frequencies as a clock;
a clock generator which receives the clock select signal, and generates and outputs the clock;
a power supply voltage controller which receives the voltage select signal, and generates and outputs a power supply voltage at an arbitrary voltage change rate; and
a circuit portion which receives the clock and power supply voltage and performs processing,
wherein when the power supply voltage is to be switched to a second voltage lower than a first voltage while said circuit portion is performing processing by using a clock having a first frequency and a power supply voltage having the first voltage,
said clock generator outputs a clock having a second frequency lower than the first frequency, and, after that,
said power supply voltage controller outputs a power supply voltage which is changed from the first voltage to the second voltage at the arbitrary voltage change rate,
on the basis of signals from said power controller;
wherein said power supply voltage controller comprises:
a maximum voltage change rate limiting unit comprising
a first current source and first switch connected in series between a power supply terminal and reference voltage output terminal,
a second switch and second current source connected in series between said reference voltage output terminal and a ground terminal,
a capacitor connected between said reference voltage output terminal and ground terminal,
an input voltage generator which receives the first and second voltages and the voltage select signal, and outputs the first or second voltage as an input voltage on the basis of the voltage select signal,
a voltage comparator which compares the input voltage with a reference voltage from said reference voltage output terminal, and outputs a comparison result, and
a switching controller which receives the comparison result, and controls ON/OFF operations of said first and second switches; and
a voltage output unit which is connected to said power supply terminal, receives the reference voltage output from said reference voltage output terminal, and outputs, to said circuit portion, a voltage having the reference voltage as the power supply voltage.

8. A circuit according to claim 7, wherein
when switching the first voltage to the second voltage,
said switching controller turns on only said second switch to discharge an electric current from said capacitor and drop the voltage of said reference voltage output terminal at the first voltage change rate, and, on the basis of the comparison result, controls ON/OFF of said first and second switches to output the second voltage from said reference voltage output terminal, and
when switching the second voltage to the first voltage,
said switching controller turns on only said first switch to inject an electric current into said capacitor and raise the voltage of said reference voltage output terminal at the second voltage change rate, and, on the basis of the comparison result, controls ON/OFF of said first and second switches to output the first voltage from said reference voltage output terminal.

9. A circuit according to claim 7, wherein
each of said first and second current sources is a variable current source, and
said power controller adjusts a voltage change rate at which the second voltage is changed to the first voltage, by outputting, to said first current source, a first current control signal for controlling a current amount of said first current source, and adjusts a voltage change rate at which the first voltage is changed to the second voltage, by outputting, to said second current source, a second current control signal for controlling an electric current amount of said second current source.

10. A semiconductor integrated circuit comprising:
a power controller which outputs a voltage select signal for selecting one of at least two types of voltages, and a clock select signal for selecting one of at least two types of clock frequencies as a clock;
a clock generator which receives the clock select signal, and generates and outputs the clock;
a power supply voltage controller which receives the voltage select signal, and generates and outputs a power supply voltage at an arbitrary voltage change rate; and
a circuit portion which receives the clock and power supply voltage and performs processing,
wherein when the power supply voltage is to be switched to a second voltage lower than a first voltage while said circuit portion is performing processing by using a clock having a first frequency and a power supply voltage having the first voltage,
said clock generator outputs a clock having a second frequency lower than the first frequency, and, after that,
said power supply voltage controller outputs a power supply voltage which is changed from the first voltage to the second voltage at the arbitrary voltage change rate,
on the basis of signals from said power controller;
wherein when the power supply voltage is to be switched from the second voltage to the first voltage while said circuit portion is performing processing by using a clock having the second frequency and a power supply voltage having the second voltage, said power supply voltage controller outputs a power supply voltage which is changed from the second voltage to the first voltage at the arbitrary voltage change rate, and, after that, said clock generator outputs a clock having the first frequency, on the basis of signals from said power controller;

wherein said power supply voltage controller comprises:

a maximum voltage change rate limiting unit comprising a first current source and first switch connected in series between a power supply terminal and reference voltage output terminal, a second switch and second current source connected in series between said reference voltage output terminal and a ground terminal, a capacitor connected between said reference voltage output terminal and ground terminal, an input voltage generator which receives the first and second voltages and the voltage select signal, and outputs the first or second voltage as an input voltage on the basis of the voltage select signal, a voltage comparator which compares the input voltage with a reference voltage from said reference voltage output terminal, and outputs a comparison result, and a switching controller which receives the comparison result, and controls ON/OFF operations of said first and second switches; and a voltage output unit which is connected to said power supply terminal, receives the reference voltage output from said reference voltage output terminal, and outputs, to said circuit portion, a voltage having the reference voltage as the power supply voltage.

11. A circuit according to claim 10, wherein when switching the first voltage to the second voltage, said switching controller turns on only said second switch to discharge an electric current from said capacitor and drop the voltage of said reference voltage output terminal at the first voltage change rate, and, on the basis of the comparison result, controls ON/OFF of said first and second switches to output the second voltage from said reference voltage output terminal, and when switching the second voltage to the first voltage, said switching controller turns on only said first switch to inject an electric current into said capacitor and raise the voltage of said reference voltage output terminal at the second voltage change rate, and, on the basis of the comparison result, controls ON/OFF of said first and second switches to output the first voltage from said reference voltage output terminal.

12. A circuit according to claim 10, wherein each of said first and second current sources is a variable current source, and said power controller adjusts a voltage change rate at which the second voltage is changed to the first voltage, by outputting, to said first current source, a first current control signal for controlling a current amount of said first current source, and adjusts a voltage change rate at which the first voltage is changed to the second voltage, by outputting, to said second current source, a second current control signal for controlling an electric current amount of said second current source.

13. A semiconductor integrated circuit comprising:

a power controller which outputs a voltage select signal for selecting one of at least two types of voltages, and a clock select signal for selecting one of at least two types of clock frequencies as a clock;

a clock generator which receives the clock select signal, and generates and outputs the clock;

a power supply voltage controller which receives the voltage select signal, and generates and outputs a power supply voltage at an arbitrary voltage change rate; and a circuit portion which receives the clock and power supply voltage and performs processing, wherein when the power supply voltage is to be switched to a second voltage lower than a first voltage while said circuit portion is performing processing by using a clock having a first frequency and a power supply voltage having the first voltage, said clock generator outputs a clock having a second frequency lower than the first frequency, and, after that, said power supply voltage controller outputs a power supply voltage which is changed from the first voltage to the second voltage at the arbitrary voltage change rate, on the basis of signals from said power controller;

wherein said power supply voltage controller comprises:

a maximum voltage change rate limiting unit comprising a first switch connected in series between a first input terminal which receives the first voltage and a reference voltage output terminal, a switch SWm connected respectively in series between an input terminal INm which receives a voltage Vm (m is an integer of not less than 1) lower than the first voltage and higher than the second voltage and said reference voltage output terminal, a second switch connected in series between a second input terminal which receives the second voltage and said reference voltage output terminal, and a switching controller which receives the voltage select signal, and controls ON/OFF operations of said first switch, switch SWm, and second switch; and a voltage output unit which is connected to said power supply terminal, receives the reference voltage output from said reference voltage output unit, and outputs, to said circuit portion, a voltage having the reference voltage as the power supply voltage, wherein when the voltage select signal selects the second voltage while only said first switch is ON and the first voltage is output from said reference voltage output terminal, said switching controller sequentially turns on from one of said switches receiving highest voltage to other switches receiving lower voltage in order to drop the voltage of said reference voltage output terminal at the predetermined voltage change rate, and finally turns on only said second switch to output the second voltage from said reference voltage output terminal, and, when the voltage select signal selects the first voltage while only said second switch is ON and the second voltage is output from said reference voltage output terminal, said switching controller sequentially turns on from one of said switches receiving lowest voltage to other switches receiving higher voltage in order to raise the voltage of said reference voltage output terminal at the predetermined voltage change rate, and finally turns on only said first switch to output the first voltage from said reference voltage output terminal.

14. A semiconductor integrated circuit comprising:

a power controller which outputs a voltage select signal for selecting one of at least two types of voltages, and a clock select signal for selecting one of at least two types of clock frequencies as a clock;

a clock generator which receives the clock select signal, and generates and outputs the clock;

a power supply voltage controller which receives the voltage select signal, and generates and outputs a power supply voltage at an arbitrary voltage change rate; and a circuit portion which receives the clock and power supply voltage and performs processing, wherein when the power supply voltage is to be switched to a second voltage lower than a first voltage while said circuit portion is performing processing by using a clock having a first frequency and a power supply voltage having the first voltage, said clock generator outputs a clock having a second frequency lower than the first frequency, and, after that, said power supply voltage controller outputs a power supply voltage which is changed from the first voltage to the second voltage at the arbitrary voltage change rate, on the basis of signals from said power controller;

wherein provided that said first voltage is V1, said second voltage is Vn (n is an integer of not less than 2), and intermediate voltages are V2, V3, Vn−1, there is a relationship of V1>V2> . . . >Vn, said power supply voltage controller comprises:

a maximum voltage change rate limiting unit comprising a first current source and current charging switch connected in series between a power supply terminal and reference voltage output terminal, a first switch SW1 connected in series between a first input terminal which receives the first voltage and said reference voltage output terminal, an intermediate voltage switch SWi (i is an integer having a relationship of 2≦i<n) connected in series between a 21st input terminal which receives respectively the intermediate voltage Vi and said reference voltage output terminal, a current discharging switch and second current source connected in series between said reference voltage output terminal and a ground terminal, a capacitor connected between said reference voltage output terminal and ground terminal, a first voltage comparator CM1 which compares the first voltage from said first input terminal with a reference voltage from said reference voltage output terminal, and outputs a first comparison result, a voltage comparator CMi which compares the intermediate voltage Vi from said intermediate voltage input terminal with the reference voltage from said reference voltage output terminal, and outputs its comparison result, a second voltage comparator Vn which compares the second voltage Vn from said second input terminal with the reference voltage from said reference voltage output terminal, and outputs its comparison result, and a switching controller which receives the voltage select signal, comparison results of said first voltage comparator CM1, said intermediate voltage comparator CMi and said second voltage comparator CMn, and controls ON/OFF operations of said switches SW1, SWi and SWn; and a voltage output unit which is connected to said power supply terminal, receives the reference voltage output from said reference voltage output terminal, and outputs, to said circuit portion, a voltage having the reference voltage as the power supply voltage, and when the voltage select signal selects the second voltage Vn while the first voltage Vi is output from said reference voltage output terminal, said switching controller turns on only said current discharging switch to discharge a current from said capacitor and drop the voltage of said reference voltage output terminal at the voltage change rate, and on the basis of a comparison result of said voltage comparator CMn, turns on only said switch SWn to output the second voltage Vn from said reference voltage output terminal, when the voltage select signal selects the intermediate voltage Vi while the first voltage V1 is output from said reference voltage output terminal, said switching controller turns on only said current discharging switch to discharge an electric current from said capacitor and drop the voltage of said reference voltage output terminal at the voltage change rate, and, on the basis of a comparison result of said intermediate voltage comparator CMi, turns on only a switch SWi to output an intermediate voltage Vi from said reference voltage output terminal, and when the voltage select signal selects the first voltage while the 2jth voltage is output from said reference voltage output terminal, said switching controller turns on only said current charging switch to inject an electric current into said capacitor and raise the voltage of said reference voltage output terminal at the voltage change rate, and, on the basis of a comparison result of the first comparator CM1, turns on only said first switch SW1 to output the first voltage V1 from said reference voltage output terminal.

* * * * *